United States Patent [19]
Crandall

[11] Patent Number: 5,999,949
[45] Date of Patent: Dec. 7, 1999

[54] TEXT FILE COMPRESSION SYSTEM UTILIZING WORD TERMINATORS

[76] Inventor: Gary E. Crandall, 13607 N.W. Indian Springs Dr., Vancouver, Wash. 98685

[21] Appl. No.: 08/818,765

[22] Filed: Mar. 14, 1997

[51] Int. Cl.[6] ................................................. G06F 17/22
[52] U.S. Cl. .......................... 707/532; 707/101; 341/51; 382/244
[58] Field of Search ..................................... 707/530, 531, 707/532, 534, 101, 100; 341/65, 59; 382/232, 233, 244, 245, 246

[56] References Cited

U.S. PATENT DOCUMENTS

| | | | |
|---|---|---|---|
| 4,672,679 | 6/1987 | Freeman | 382/233 |
| 4,747,053 | 5/1988 | Yoshimura et al. | 707/532 |
| 4,899,148 | 2/1990 | Sato et al. | 341/65 |
| 5,325,091 | 6/1994 | Kaplan et al. | 341/51 |
| 5,373,290 | 12/1994 | Lempel et al. | 341/51 |
| 5,374,928 | 12/1994 | Moore et al. | 341/67 |
| 5,375,204 | 12/1994 | Motoyama et al. | 345/507 |
| 5,394,534 | 2/1995 | Kulakowski et al. | 711/112 |
| 5,396,228 | 3/1995 | Garahi | 340/825.44 |
| 5,442,350 | 8/1995 | Iyer et al. | 341/51 |
| 5,467,087 | 11/1995 | Chu | 341/51 |
| 5,521,940 | 5/1996 | Lane et al. | 375/240 |
| 5,530,645 | 6/1996 | Chu | 707/532 |
| 5,553,283 | 9/1996 | Kaplan et al. | 707/101 |
| 5,561,421 | 10/1996 | Smith et al. | 341/51 |
| 5,638,498 | 6/1997 | Tyler et al. | 395/117 |
| 5,663,721 | 9/1997 | Rossi | 341/51 |
| 5,673,042 | 9/1997 | Yoshida et al. | 341/51 |
| 5,754,847 | 5/1998 | Kaplan et al. | 707/100 |
| 5,761,688 | 6/1998 | Morishita | 707/532 |
| 5,861,827 | 1/1999 | Welch et al. | 341/51 |
| 5,870,036 | 2/1999 | Franaszek et al. | 341/51 |

*Primary Examiner*—Stephen S. Hong
*Assistant Examiner*—Robert D Bourque
*Attorney, Agent, or Firm*—Smith-Hill and Bedell

[57] ABSTRACT

A system for compressing an ASCII or similarly encoded text file creates an alphabetically ordered main dictionary listing all unique words appearing in the text file. A text file "word" is defined as a sequence of characters ending with one or more "word terminators" such as spaces, commas, periods and carriage returns. The compression system also creates a common word dictionary referencing words most often encountered in the text file. The sequence of words forming the text file is represented by a word index, a list of one byte and two byte references to common and main dictionary words, respectively. The system compresses the main dictionary using three complementary techniques. First, leading characters of each dictionary word matching leading characters of a next preceding dictionary word are represented by data indicating the number of matching characters. Second, commonly encountered dictionary word suffixes are represented by data referencing entries of a small suffix dictionary. Third, remaining characters of main dictionary words are represented by bytes encoded to represent commonly encountered characters and groups of characters. The system also compresses style data structures often included in word processing text files.

35 Claims, 7 Drawing Sheets

| | | | | | | |
|---|---|---|---|---|---|---|
| 0 NEXT BYTE | 40 ( | 80 P | 120 x | 160 ep | 200 ng | 240 tr |
| 1 <sp> | 41 ) | 81 Q | 121 y | 161 er | 201 ni | 241 ts |
| 2 <sp><sp> | 42 * | 82 R | 122 z | 162 es | 202 ns | 242 tt |
| 3 <sp><sp> <sp> | 43 + | 83 S | 123 { | 163 et | 203 nt | 243 tu |
| 4 <cr> | 44 , | 84 T | 124 \| | 164 ev | 204 oc | 244 ty |
| 5 <cr><sp> | 45 - | 85 U | 125 } | 165 ex | 205 oi | 245 ul |
| 6 <cr><sp><sp> | 46 . | 86 V | 126 ~ | 166 fe | 206 ol | 246 un |
| 7 <cr><sp><sp><sp> | 47 / | 87 W | 127 | 167 fi | 207 om | 247 ur |
| 8 , | 48 0 | 88 X | 128 | 168 fo | 208 on | 248 us |
| 9 ,<sp> | 49 1 | 89 Y | 129 | 169 ge | 209 op | 249 ut |
| 10 ,<sp><sp> | 50 2 | 90 Z | 130 | 170 gh | 210 or | 250 ve |
| 11 ,<sp><sp><sp> | 51 3 | 91 [ | 131 | 171 gr | 211 os | 251 vi |
| 12 . | 52 4 | 92 \ | 132 ac | 172 he | 212 ot | 252 wa |
| 13 .<sp> | 53 5 | 93 ] | 133 af | 173 hi | 213 ou | 253 we |
| 14 .<sp><sp> | 54 6 | 94 ^ | 134 ai | 174 ho | 214 ov | 254 wh |
| 15 .<sp><sp><sp> | 55 7 | 95 _ | 135 al | 175 id | 215 ow | 255 wr |
| 16 <tab> | 56 8 | 96 ` | 136 an | 176 ie | 216 pe | |
| 17 <tab><sp> | 57 9 | 97 a | 137 ar | 177 ig | 217 pl | |
| 18 <tab><sp><sp> | 58 : | 98 b | 138 as | 178 il | 218 po | |
| 19 <tab><sp><sp><sp> | 59 ; | 99 c | 139 at | 179 im | 219 pr | |
| 20 - | 60 < | 100 d | 140 au | 180 in | 220 ra | |
| 21 -<sp> | 61 = | 101 e | 141 be | 181 io | 221 re | |
| 22 -<sp><sp> | 62 > | 102 f | 142 bl | 182 ir | 222 ri | |
| 23 -<sp><sp><sp> | 63 ? | 103 g | 143 ca | 183 is | 223 ro | |
| 24 - | 64 @ | 104 h | 144 ce | 184 it | 224 rr | |
| 25 <pb><sp> | 65 A | 105 i | 145 ch | 185 iv | 225 rs | |
| 26 <pb><sp><sp> | 66 B | 106 j | 146 co | 186 lc | 226 rt | |
| 27 <pb><sp><sp><sp> | 67 C | 107 k | 147 cr | 187 le | 227 ry | |
| 28 <spb> | 68 D | 108 l | 148 ct | 188 li | 228 se | |
| 29 <spb><sp> | 69 E | 109 m | 149 de | 189 ll | 229 sh | |
| 30 <spb><sp><sp> | 70 F | 110 n | 150 di | 190 lo | 230 si | |
| 31 <spb><sp><sp><sp> | 71 G | 111 o | 151 ea | 191 ly | 231 sp | |
| 32 | 72 H | 112 p | 152 ec | 192 me | 232 ss | |
| 33 ! | 73 I | 113 q | 153 ed | 193 mi | 233 st | |
| 34 " | 74 J | 114 r | 154 ee | 194 mo | 234 su | |
| 35 # | 75 K | 115 s | 155 eg | 195 mp | 235 ta | |
| 36 $ | 76 L | 116 t | 156 ei | 196 na | 236 te | |
| 37 % | 77 M | 117 u | 157 el | 197 nc | 237 th | |
| 38 & | 78 N | 118 v | 158 em | 198 nd | 238 ti | |
| 39 ' | 79 O | 119 w | 159 en | 199 ne | 239 to | |

FIG. 8

TEXT FILE COMPRESSION SYSTEM UTILIZING WORD TERMINATORS

BACKGROUND OF THE INVENTION

1. Field of the Invention

The present invention relates in general to word processing and other systems which produce and read text files, and in particular to a system for compressing such text files for compact storage and rapid transmission.

2. Description of Related Art

Although computer hardware improvements have progressively increased the capacity and reduced the cost of data storage media, interest in compressing computer data files has continued. With computers increasingly interlinked to one another via narrow bandwidth channels, it's quicker to transmit a data file from one computer to another when its compressed. The Internet, with its World Wide Web of computers, has made vast quantities of documents stored on thousands of computers around the world readily available to anyone having a computer, a modem, a phone line, and some inexpensive browser software. However, though documents are readily available through the Internet, they are not always quickly available. Modems and telephone lines have limited bandwidth and large documents require a fair amount of transmission time.

A great many data compression schemes have been proposed and are in use. Some of these schemes are directed primarily to compressing text files representing documents written in a character-based language such as English. Such text files are usually sequences of 8-bit (one byte) character codes, each successive byte representing a successive character of the document in accordance with a standardized encoding code system. Most 8-bit encoding schemes are variations on the ASCII encoding system which assigns common upper and lower case alphanumeric characters, punctuation marks and control characters to the lower 128 ASCII codes. Since an 8-bit encoding system encodes up to 256 characters, the remaining upper 128 codes may be assigned to various special characters such as graphics characters, mathematical symbols, special language characters and the like. While an 8-bit ASCII encoding system is a convenient way for a computer to handle characters when processing text documents, it is not a particularly compact way of representing documents.

"Context sensitive encoding" compression schemes make use of fact that in a given language characters do not appear in random sequence but rather tend to occur more frequently in some groups than others. For example in English the pair "qu" occurs more frequently than the pair "qx". The triplet "ing" occurs more often than the triplet "inx". In a context sensitive encoding system, the character represented by a code value depends on the character(s) preceding it in the text file. This enables characters to be represented with fewer bits. U.S. Pat. No. 4,672,679 issued Jun. 9, 1987 to Freeman describes a typical context sensitive encoding compression system.

"Dictionary" type data compression systems capitalize on the fact that words are often repeated in a document. If we use a dictionary to assign, for example, a 16-bit code to each unique word, then we can represent each word with two bytes instead of representing each character of a word with one byte. Since most words have more than 2 characters, a level of compression can be achieved if both compressing and decompressing software have the same dictionary available. Unfortunately 16-bits may be insufficient to uniquely represent each word that may be encountered in a document, particularly since documents containing spelling errors. Also new words make old dictionaries rapidly obsolete. Thus in systems having fixed dictionaries, words not found in a dictionary cannot be compressed. Some systems using fixed dictionaries also create second "adaptive" dictionaries for representing document words that do not appear in the fixed dictionary. The adaptive dictionary is added to the compressed document so that decompression software can refer to it when it cannot find a word in the fixed dictionary. Typical of this approach are U.S. Pat. No. 5,530,645 issued Jun. 25, 1996 to Chu and U.S. Pat. No. 4,899,148 issued Feb. 6, 1990 to Sato et al. One major disadvantage to fixed and "fixed+adaptive" dictionary systems is that the receiving computer must already store a copy of the fixed dictionary. Such systems do not lend themselves well to open networks such as the Internet where there is no assurance that the client computer receiving the document has the appropriate fixed dictionary. In open network environments it is preferable to transmit "self-extracting" compressed files able to decompress themselves without relying on fixed dictionaries or other information stored by the receiving computer.

"Adaptive dictionary systems" employ only a single dictionary created as the text file is being compressed. An adaptive dictionary is normally much smaller than a fixed dictionary because most documents use a substantially fewer number of unique words than would appear in a fixed dictionary. However, though the text file itself can be substantially compressed, much of the compression advantage is lost when the adaptive dictionary must be stored or transmitted with the compressed text file to provide the information needed for decompression. Also prior art dictionary systems typically do not compress characters such as spaces, punctuation and carriage returns that normally appear between words. Yet these characters typically comprise a significant portion of a document.

There have been efforts to compress spelling dictionaries. U.S. Pat. No. 4,747,053 issued May 24, 1988 to Yoshimura, discloses a relatively effective system for compressing a spelling dictionary in which all words of the spelling dictionary are arranged in alphabetical order. Each dictionary entry consists of several parts. A first part of a dictionary represents a number of leading characters the word has in common with the word of the preceding dictionary entry. A second part of a dictionary entry indicates where the word's suffix, if any, appears on a table of common suffixes. A third part of the entry consist of standard character codes for each character not represented by the first or second parts of the entry. While this system produces a relatively high degree of compression for a spelling dictionary, it provides no further compression for characters occurring between the leading characters and the suffix.

What is needed is a system for rapidly and substantially compressing a text document so that it may be compactly stored, rapidly transmitted and rapidly expanded without need for supplemental information.

SUMMARY OF THE INVENTION

The object of the present invention is to compress a text document so that it may be compactly stored, rapidly transmitted and quickly expanded without need for supplemental decompression information.

In accordance with one aspect of the invention, the text file compression system creates a main dictionary having entries containing each unique word of the text file. Each dictionary "word" is a unique sequence of characters occurring in one or more parts of the text file. Each word ends with a continuous set of one or more selected "word terminators", characters that normally separate words in a text document such as spaces, commas, periods or carriage returns. Word terminators occur only at the end of a dictionary word. Each entry of the main dictionary is referenced by a unique two byte code.

In accordance with another aspect of the invention, the compression system also creates a second "common word" dictionary having entries listing main dictionary entries containing the most commonly encountered words in the text file. Each common word dictionary entry is referenced by a one byte code.

In accordance with a further aspect of the invention, the compression system represents the sequence of words forming the text file as a word index, a sequence of one byte and two byte references to common word and main dictionary entries. The manner in which the one byte and two byte references are encoded and arranged in the word index allows decompression software to determine whether each successive byte of the word index is a one byte reference to a common word dictionary entry or a part of a two byte reference to a main dictionary entry.

In accordance with yet another aspect of the invention, the compression system also compresses the main dictionary. In the compressed main dictionary, leading characters of each dictionary word matching leading characters of a next preceding dictionary word are replaced with data indicating the number of matching characters. Commonly encountered dictionary word suffixes are represented by data referencing a common suffix dictionary. Remaining characters of a dictionary word are represented by bytes, encoded to represent both individual and commonly encountered groups of characters.

In accordance with a still further aspect of the invention, the compression system employs yet another dictionary to compress style data structures often included in word processing text files.

The combined output of the compression system, including the word index, the compressed main and common word dictionaries, is normally only one tenth to one fourth the size of the text file and can be quickly decompressed with relatively small decompression software that may be included with the compressed data file so as to make the compressed data file self-extracting.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING (S)

FIG. 1 is a simplified block diagram illustrating a computer system for implementing the present invention, FIG. 2 is a high level flow chart illustrating the compression software of FIG. 1, FIG. 3 is a flow chart illustrating a routine for generating the main dictionary of FIG. 1, FIG. 4 is a flow chart illustrating a routine for identifying a word in the text file of FIG. 1, FIG. 5 illustrates bytes of a main dictionary reference number, FIG. 6 is a flow chart illustrating a routine for generating the common word dictionary of FIG. 1, FIG. 7 is a flow chart illustrating the routine for generating the word index of FIG. 1, FIG. 8 illustrates an encoding system suitable for use when compressing the main dictionary to form the compressed main dictionary of FIG. 1, FIG. 9 is a flow chart illustrating a routine for compressing the main dictionary to form the compressed main dictionary of FIG. 1, and FIG. 10 is a flow chart illustrating the decompression software of FIG. 1.

DESCRIPTION OF THE PREFERRED EMBODIMENT (S)

System Topology

A text file may be encoded using an ASCII or similar encoding system in which each unique character of a document is represented by a unique code. An eight-bit code can represent up to 256 unique characters. While computers find an 8-bit ASCII or similar encoding system to be convenient for handling characters when processing text documents, ASCII encoded text files are not particularly compact. The present invention is a system for compressing a text file so that it may be more compactly stored, and more rapidly transmitted to a remote computer. The compressed text file contains all information the remote computer needs to reconstruct the uncompressed text file without relying on supplemental information.

Figure 1:
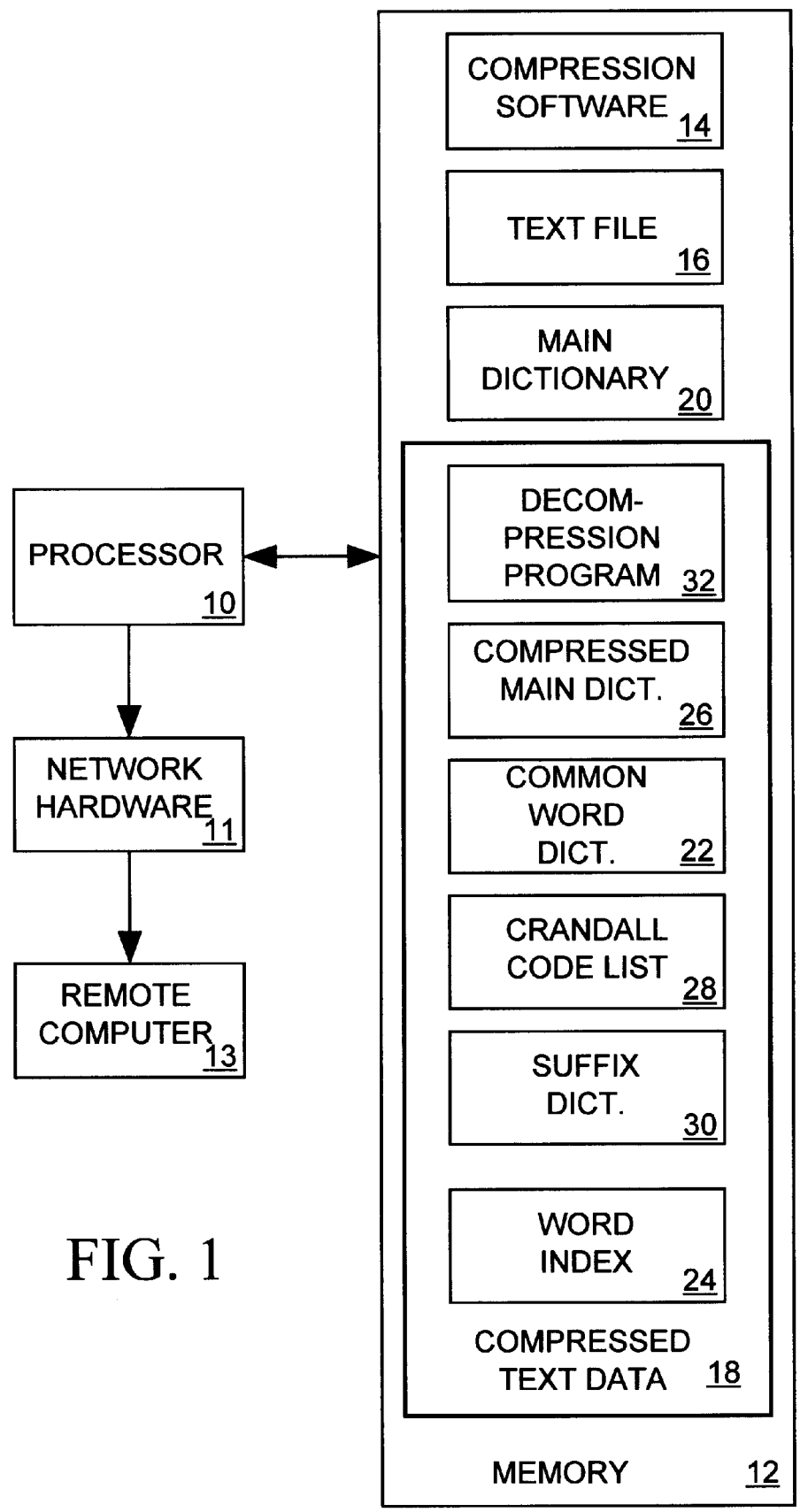

FIG. 1 illustrates a computer system implementing the present invention. The computer system includes a processor 10 linked to memory 12. Memory 12 may include random access memory as well as bulk storage devices. In accordance with the invention, processor 10, operating under control of compression software 14 stored in memory 12, compresses a text file 16 to produce compressed text data 18 conveying the same information as text file 16 but in a more compact form. The compressed text data 18, being substantially smaller than text file 16 can be more rapidly transmitted via network hardware 11 to a remote computer 13. The compressed text data 18 contains not only all the information the remote computer 13 needs to reconstruct text file 16, it also contains the necessary decompression software 32.

Figure 2:
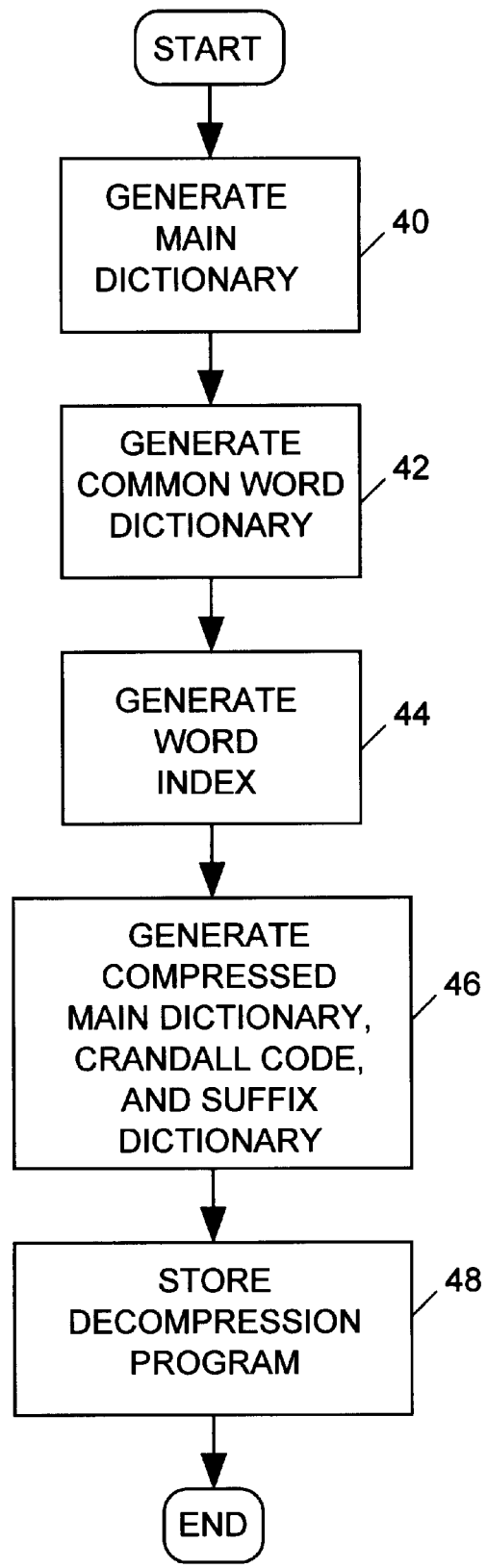

FIG. 2 is a high level flow chart illustrating compression software 14. When executing compression software 14, processor 10 of FIG. 1 initially scans text file 16 to generate a main dictionary 20 (step 40 of FIG. 2) and a common word dictionary 22 (step 42). The main dictionary 20 contains a list of all unique words in text file 16. The common word dictionary 22 identifies the main dictionary entries containing most commonly encountered words in text file 16. The common word dictionary 22 and the main dictionary 20 together assign a unique one byte code to each of the most commonly encountered dictionary words and a unique two byte code to all other dictionary words. After producing the dictionaries, processor 10 generates a word index 24 (step 44) by replacing each word in text file 16 with its assigned one or two byte code. Word index 24 is a greatly compressed form of text file 16; in text file 16 every character of a word is represented by one byte, whereas in word index 24 each entire word is represented by only one or two bytes.

Although word index 24 is much smaller than text file 16, in order for remote computer 13 to translate word index 24 back into text file 16, computer 13 must have available the main and common word dictionaries 20,22. Although common word dictionary 22 is relatively small, main dictionary 20 can be very large since it includes one entry for every unique word in text file 16. Thus without further compression, the combination of word index 24, main dictionary 20 and common word dictionary 22 would normally represent a relatively low level of compression over the original text file 16.

To further improve text file compression after creating the word index 24, processor 10 also compresses the main dictionary 20 to produce a compressed main dictionary 26, much smaller than main dictionary 20 (step 46, FIG. 2). In the course of generating the compressed main dictionary 26, processor 10 produces two small data files, a "Crandall Code" list 28 and a suffix dictionary 30, described below. The common word dictionary 22, the word index 24, the compressed main dictionary 26, the Crandall code list 28, and the suffix dictionary 30 included in the compressed text data 18 contain all information a remote computer 13 needs to reconstruct text file 16. Typically the text file 16 will be 4 to 10 times larger than compressed text data 18. In the preferred embodiment of the invention compression software 14 also directs processor 10 to include a small decompression program 32 as part of compressed text data 18 (step 48) for reconstructing the text file 16 from the rest of the compressed text data 18. Decompression program 32 makes the compressed text data 18 "self-decompressing" in that it contains not only all information needed to reconstruct the text file 16, but also an executable program 32 that can carry out the reconstruction.

Generating the Main Dictionary

The compression system of the present invention has a unique view of a text document and the words that form it. We normally view a document as being a sequence of "words" separated by "word separators" such as spaces, punctuation marks, tabs and the like. In prior art dictionary systems a "word" is normally taken to be any contiguous sequence of characters other than word separators. Thus in the character sequence "abc<sp>xyz<sp><tab>" there are two words, "abc" and "xyz", separated by a single space (<sp>) character. A space and a tab (<tab>) character follow the second word.

In contrast, the compression system of the present invention treats spaces, punctuation marks, tabs and the like as "word terminators" rather than as "word separators". Word terminators are treated as a part of a word; they are included at its end. Thus the character sequence abc<sp>xyz<sp><tab> has two contiguous words "abc<sp>" and "xyz<sp><tab>". The system therefore views a text file as a sequence of contiguous words, each word including one or more word terminators, instead of as a sequence of words separated by word separators. Table 1 lists an example set of characters treated as word terminators.

TABLE 1

| Character | Symbol |
| --- | --- |
| space | <sp> |
| carriage return | <cr> |
| comma | , |
| period | . |
| tab | <tab> |
| hyphen | - |
| page break | <pb> |
| soft page break | <spb> |

It should be understood that the particular set of characters treated as word terminators need not be fixed but can be selected to include any type of word terminators actually employed in a text file.

The unique "words" stored in main dictionary 20 may therefore include any kind of character including alphanumeric characters, symbols, graphics characters, spaces, punctuation marks, control codes and the like. However each dictionary word starts with a character other than a word terminator. A word may include one or more word terminators, but all word terminators must occur at the end of a word. The character sequences "<sp>hello" and "he<sp>llo" are not proper main dictionary words because space word terminator appears other than at the end of the word. The character sequences "hello<sp>" and "hello<sp><cr>" are proper dictionary words because the space and carriage return word terminators occur only at the end of each word. When creating the main dictionary, processor 10 sequentially scans through the sequence of bytes forming text file 16 and uses this definition of a "word" to determine when one word ends and a next word begins. Each "word" of the text is assumed to start with the first non-word terminator following a word terminator and to end with the next encountered contiguous set of one or more word terminators.

Since the main dictionary lists all unique words of text file 16, the word terminators appearing at the end of a word can distinguish one "unique" word from another. For example the main dictionary 20 would have separate entries for the words "hello<sp>", "hello<sp><sp>", and "hello<sp><tab>". By treating spaces, tabs, periods and the like as word terminators (part of words) rather than as word separators (separating words), the system eliminates the need to separately encode word separators in word index 44. This manner of defining words therefore helps to reduce the size of the word index.

Figure 3:
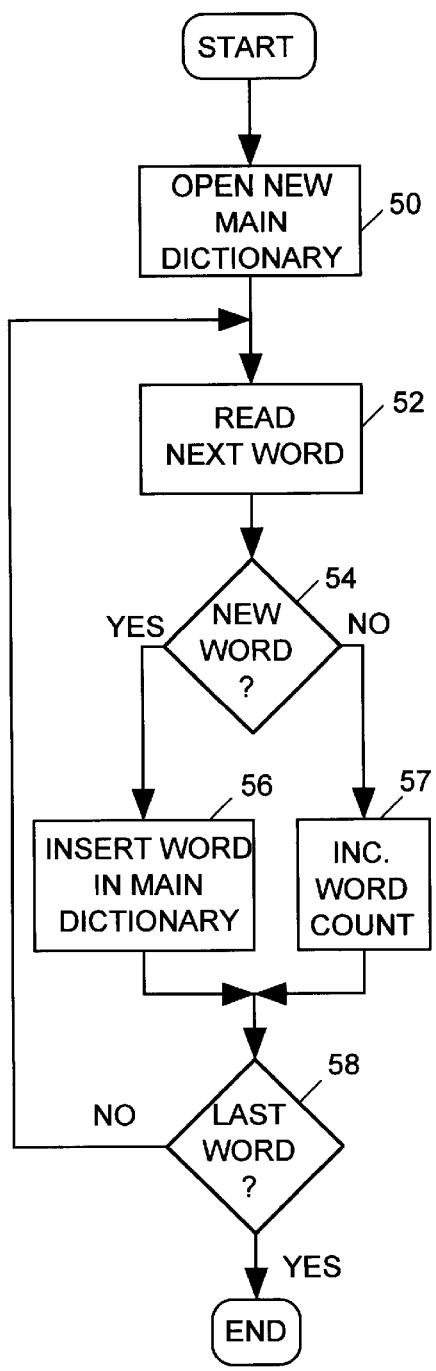

FIG. 3 is a flow chart illustrating a routine for carrying out step 40 of FIG. 2, generating the main dictionary 20. The main dictionary creation routine of FIG. 3 begins by opening a new main dictionary file (step 50) and then reading a next word (initially the first word) out of text file 16 (step 52). The routine then compares the word with previous entries to determine if the word is a new word, not already included in the main dictionary (step 54). If the word is new, the routine inserts the word as a new entry at the appropriate alphabetic position in the main dictionary (step 56). The routine arranges main dictionary entries "alphabetically" in the order in which the characters of the text file are encoded. For example in the ASCII system, the character "A" would come before the character "B" because "A" has code value 85 and "B" has code value 86. Such ordering maximizes the number of leading character bytes each word of a main dictionary entry has in common with a word contained in its next preceding main dictionary entry. If a word read out from the text file is not new (step 54), the routine does not insert the word into the main dictionary at step 56. However, to determine the most common words appearing in the text file, the routine maintains a count of the number of times each unique dictionary word occurs in text file 16. Thus when it encounters a word at step 54 already included in the main dictionary, the routine increments the count for that particular word (step 57). In any case, after updating the main dictionary at step 56 or after incrementing a word count at step 57, the routine determines whether the word is the last word of text file 16 (step 58). If not, the routine returns to step 52, reads the next word out of the text file and then repeats steps 54–58. When the last word of the file has been processed (step 58), the main dictionary is complete and the routine ends.

Figure 4:
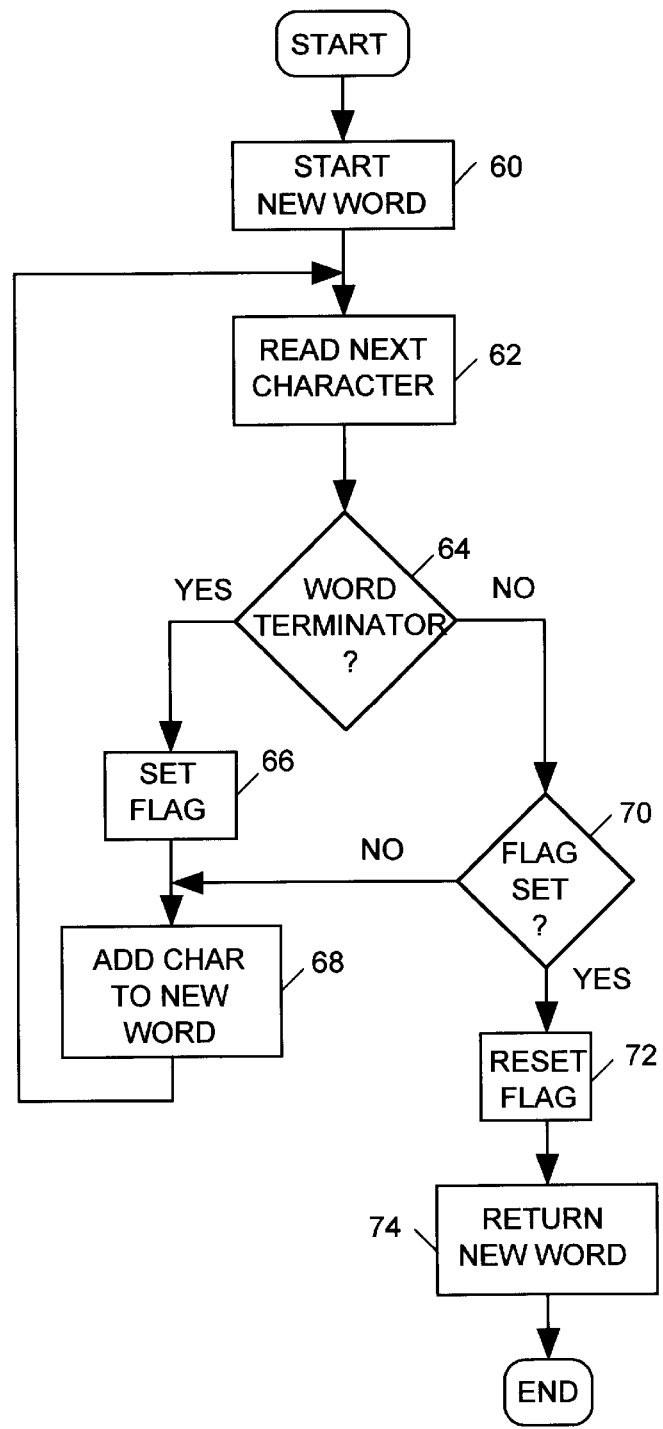

FIG. 4 illustrates a routine for reading a next word (step 52 of FIG. 3). The routine starts a new word at step 60 by reserving memory space for it. It then reads a next character out of text file 16 (step 62). If that character is a word terminator (step 64), the routine sets a flag (step 66) indicating that the word has begun to terminate, adds the word terminator to the new word (step 68), and then returns to step 62 to read a next character. If the last read character is not a word terminator (step 64) then the routine checks the word terminator flag (step 70). If the flag has not been set, the routine adds the character to the new word and returns to step 62 to read a new character. When the routine encounters a character that is not a word terminator and sees that the termination flag has been set (step 70), the routine assumes that the character is starting a next word. In that case the routine resets the flag (step 72), returns the completed word as the next word to the main dictionary routine (step 74) and then ends. Note that since the last character read at step 62 was not a word terminator it was not added to the word returned to the main dictionary routine. When the routine of FIG. 4 is next called, it rereads that character at step 62 and uses it as the first character of the next word.

Generating the Common Word Dictionary

The main dictionary 20 contains an entry for every unique word in the text file. Each entry is referenced by a two byte code. Thus when processor 10 builds word index 24 (step 44, FIG. 2), it could represent any word of text file 16 with a two byte reference to a main dictionary 20 entry matching that word. However to further reduce the size of word index 24, the most commonly occurring words in text file 16 are instead represented in word index 24 as a one byte reference to an entry in common word dictionary 24.

Since each entry of the main dictionary 20 is referenced by a unique two byte (16-bit) number, the main dictionary may have up to $2^{16}$ (65536) entries. The common word dictionary 22 of FIG. 1 is simply a list of two byte references to a set of main dictionary 20 entries. The particular main dictionary entries referenced by common word dictionary 22 are those having the highest word counts. Thus common word dictionary 22 identifies the most commonly encountered words in text file 16 by referencing their corresponding main dictionary 20 entries.

Each entry of the common word dictionary is itself referenced by a unique one byte (8-bit) number. Although the common word dictionary could have up to $2^8$ (256) entries, the actual size of common word dictionary 22 is limited by the number of entries in the main dictionary 20. The larger the main dictionary, the smaller the common word dictionary. The reason behind the limitation in common word dictionary size relates to the manner in which a single byte in word index 24 referring to an entry in the common word dictionary 22 is distinguished from the upper byte of a two byte reference to an entry in the main dictionary 20.

Figure 5:
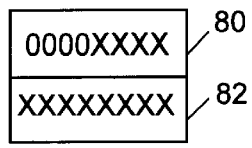

FIG. 5 illustrates the most significant (upper) byte 80 and the least significant (lower) byte 82 of a two byte main dictionary reference number in the order decompression software would encounter them in the word index. Although the two byte main dictionary reference numbering system permits up to 65536 dictionary entries, most documents contain between 1024 and 4096 unique words. Thus, with main dictionary entries numbered consecutively, only 10–12 of the least significant bits of the 16-bit main dictionary reference number are normally needed. Assume, for example, 12 bits are needed for a 4000 word main dictionary. When a two byte (16-bit) main dictionary reference number is stored in word index 24 to represent a corresponding word of text file 16, the two bytes appear in sequence in the word index as shown in FIG. 5. Upper byte 80 appears first. Each byte 80 and 82 has eight bits, each represented in FIG. 5 as an "X" or a "0". An "X" indicates that the bit may be either a "1" or a "1" while a "0" indicates that the bit can only be a "0". Since in the example case, the main dictionary has no more than 4096 entries, and since the entries are numbered consecutively, the four most significant bits of the 16-bit reference number (the last four bits of upper byte 80) will always be 0's as shown in FIG. 5. If we look at upper byte 80 as a single byte number, that number can only range in value from (00000000) through (00001111), or 0–15 decimal. The 240 other unique values of the upper byte from 16–255 are not used.

Thus in this example, where we have 4000 main dictionary entries, the system limits the size of the common word dictionary 22 to 240 entries and identifies each entry with a unique 8-bit number in the range 16–255. In doing so, the system ensures that the upper byte of a two byte main dictionary entry reference car always be distinguished from a single byte common word dictionary entry reference. They occupy non-overlapping ranges of values. Thus the compression system can build word index 24 as an intermingled sequence of two byte main dictionary entry references and one byte common word dictionary entry references without providing any additional information identifying whether a given byte is a one byte reference or part of a two byte reference. When the word index is decompressed, the decompression software can determine from the value of the first byte in the index whether that byte is a one byte common dictionary reference or the upper byte of a two byte main dictionary reference. If the byte is a one byte reference, the decompression software uses the byte to access a common word dictionary which points to the appropriate main dictionary entry. If the byte is the upper byte of a two byte reference, the decompression software reads the next byte of the word index to attain the second byte of the main dictionary reference and then uses the two bytes to access the main dictionary.

For documents having fewer than 256 unique words, the main dictionary has less than 256 entries and the upper byte of the main dictionary reference is not needed. For such documents every word is a common word and can be represented in the word index by single bytes. As the main dictionary increases in size above 256 words, progressively more bits of the main dictionary reference number are needed. This progressively reduces the allowable range of values of one byte references to the common word dictionary. Table 2 lists the common word dictionary size for the various ranges of main dictionary sizes.

TABLE 2

| Main | Common Word |
| --- | --- |
| Up to 255 | Up to 255 |
| 256–511 | 254 |
| 512–1,023 | 252 |
| 1,024–2,047 | 248 |
| 2,048–4,095 | 240 |
| 4,096–8,191 | 224 |
| 8,192–16,383 | 192 |
| 16,384–32,767 | 128 |
| Over 32,768 | 0 |

Figure 6:
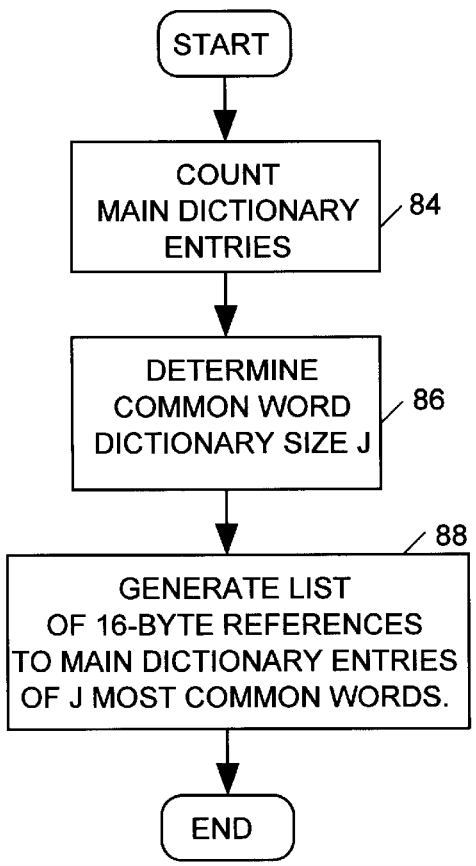

FIG. 6 is a flow chart illustrating a routine for generating common word dictionary 22, step 42 of the main compression routine of FIG. 2. Beginning at step 84, the routine counts the number of entries in the main dictionary 20. The routine then determines the allowable number J of common word dictionary entries based on the counted number of main dictionary entries in accordance with Table 2 (step 86). Thereafter the routine compares the word counts for all entries of the main dictionary (produced at step 57 of FIG. 3) to ascertain the J most common words of the document. It then generates the common word dictionary as a list of J two byte numbers, each number referencing a separate entry of the main dictionary (step 88).

Generating the Word Index

Figure 7:
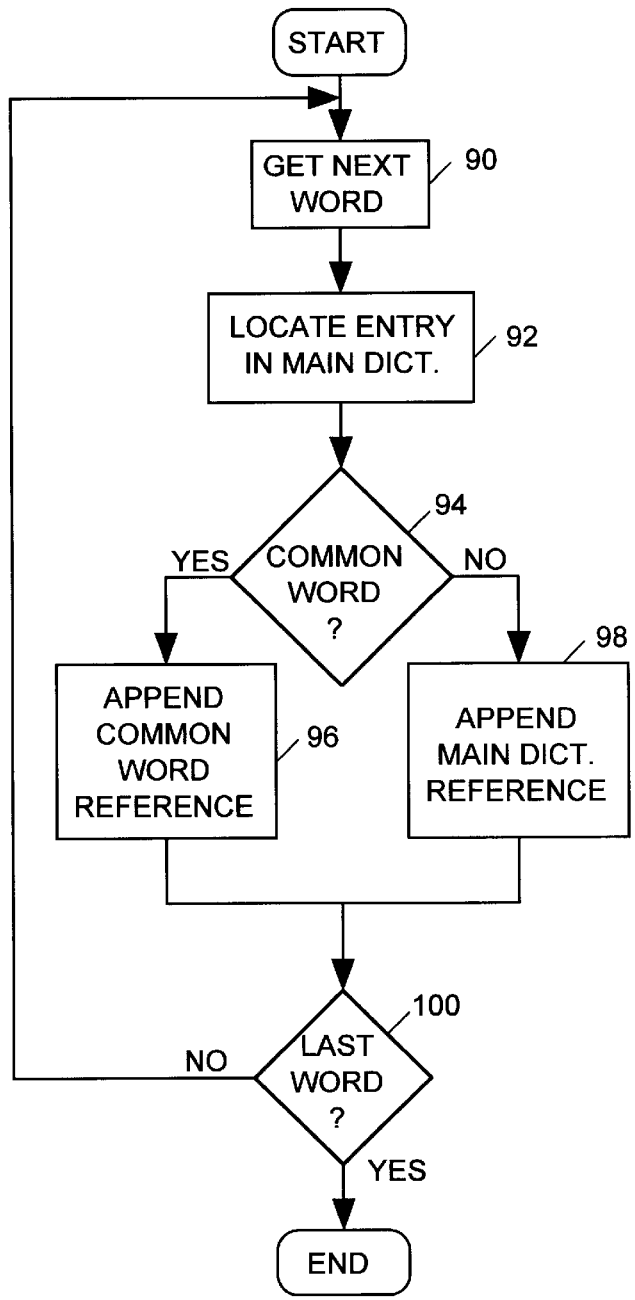

FIG. 7 is a flow chart illustrating step 44 of FIG. 2, a routine for generating word index 24 of FIG. 1. Beginning at step 90, the routine reads a next word (initially the first word) of the text file 16 of FIG. 1. The routine then locates the appropriate entry for that word in main dictionary 20 (step 92). Since the main dictionary is alphabetically ordered, the appropriate entry can be quickly found. The routine thereafter looks for a reference to that main dictionary entry in the common word dictionary 22 (step 94). If it finds an entry of the common word dictionary pointing to the main dictionary entry, the routine appends a one byte reference to the common word dictionary entry to the word index 24 to represent the word read out of the text file 16 (step 96). However if the routine finds no entry in the common word dictionary pointing to the appropriate main word dictionary entry, the routine appends a two byte reference to the appropriate main dictionary entry to the word index 24 (step 98).

After storing a one or two byte reference in the word index, the routine determines whether it has processed the last word of text file 16 (step 100). If not, the routine returns to step 90 to obtain and begin processing the next word of the text file. When all words of text file 16 have been processed and an appropriate one or two byte dictionary reference number has been stored in word index 24 for each word of text file 16, the routine ends following step 100.

The main dictionary entries are referenced consecutively in the order stored in memory starting with number 0. When the system stores a two byte reference to the main dictionary in the word index 24, it determines the position of the entry in the main dictionary and uses the 16-bit position number as the entry reference. In contrast common word dictionary entries are referenced in reverse order of dictionary position starting with number 255. Thus the first entry of the common word dictionary is entry number 255 and the last entry is entry number 255-J, where J is the total number of common word dictionary entries. When the routine stores a single byte common word dictionary entry reference number in word index 24 at step 96, it subtracts the dictionary position from 255 to determine the value of the common dictionary reference number.

Creating the Compressed Main Dictionary

The word index 24 generated at step 44 of the main compression routine of FIG. 2 is a greatly compressed version of the original text file 16, but it cannot be expanded without referring to the main and common word dictionaries 20 and 22. The combined size of word index 24, main dictionary 20 and common word dictionary 22 may not be greatly smaller than the uncompressed text file 16, particularly for small text files. While common word dictionary 22 is relatively small, main dictionary 20 can be very large, sometimes larger than word index 24. In accordance with the present invention, the main dictionary is compressed at step 46 of the compression routine of FIG. 2. For each successive entry of the uncompressed dictionary the system creates a corresponding, usually much smaller, entry of the compressed dictionary. The system employs three compression techniques, described below, which cooperate to produce a relatively high dictionary compression ratio.

Leading Character Compression

As mentioned above, the main dictionary entries are entered in alphabetical order to maximize the number of matching leading characters. The first dictionary compression technique makes use of the fact that since the main dictionary is alphabetized, the first 1 to 15 characters of each word entry are likely to match those of the next preceding word entry. In creating a comnpressed dictionary entry corresponding to a main dictionary entry, the first nibble (4 bits) of first byte (8 bits) of the compressed dictionary entry is given a value indicating the number N of starting characters of the corresponding main dictionary word matching starting characters of a preceding word of the main dictionary. By using four bits, N can have any value from 0 to 15. Thus the first N characters of the each main dictionary word are compressed to a single four-bit nibble.

Note that there is a symbiotic relationship between two compression techniques. Recall that the system defines dictionary words so as to include word terminators, thereby reducing the size of the word index since word terminators need not be referenced separately from the words they terminate. Thus strings such as "compute<sp>", "computer.<sp>" and "computer,<sp><sp>" appear as separate, consecutive dictionary entries. Although this compression technique increases the size of the main dictionary, the main dictionary thus produced becomes particularly susceptible to compression using the matching leading character technique.

fix Compression

A second main dictionary compression technique makes use of the fact that in most languages, a few two-character and three-character suffixes are very common. The compression system assigns a separate four-bit code to each of 15 common suffixes and uses the second nibble of the first byte of each compressed dictionary entry to indicate whether the last two or three characters of the dictionary word (other than its word terminators) form one of those commonly encountered suffixes. Table 3 illustrates a dictionary of 15 common suffixes in the English language and shows how the compression system can assign separate four-bit second nibble value to each suffix. A second nibble value of 15 is reserved to indicate that the word does not include one of the common suffixes.

TABLE 3

| Value | Suffix |
|---|---|
| 0 | all |
| 1 | ant |
| 2 | ble |
| 3 | ent |
| 4 | ial |
| 5 | ied |
| 6 | ing |
| 7 | ion |
| 8 | ce |
| 9 | ed |
| 10 | en |
| 11 | er |
| 12 | es |
| 13 | le |
| 14 | ly |
| 15 | (no suffix) |

Thus this second step of dictionary compression allows two or three bytes of many dictionary entries to be represented by only four bits.

Although the suffix dictionary of Table 3 provides good compression results for most English language documents, a different suffix dictionary could be used. For example, since the most common suffixes vary somewhat from language to language, some improvement in compression may be had by providing a separate suffix dictionary for each language and letting the compression system choose the appropriate suffix dictionary for document being compressed. Alternatively a customized suffix dictionary can be generated at compression time, for example, simply by counting occurrences of every type of two or three character suffix appearing in the main dictionary and choosing the 15 most common. Listed suffixes need not be limited to three characters.

Crandall Encoding

As discussed above, the first byte of each compressed dictionary entry represents up to 15 leading characters of the corresponding main dictionary entry and up to three common suffix characters immediately preceding the word terminator character(s). The compression system of the present invention employs "Crandall Encoding" to compress the remaining characters of each main dictionary entry.

A typical 8-bit encoding system, such as an extended ASCII system, relates each unique character or control code to a corresponding unique 8-bit code, thereby defining 256 different characters or control codes. In 8-bit extended ASCII encoding systems, the most commonly used characters such as upper and lower case alphabetical characters, numerals 0–9, space, tab, common punctuation marks, and control codes are assigned ASCII numbers from 0–127. Various versions of the extended ASCII code use the remaining (extended) ASCII numbers from 128–255 to represent special character sets as may be used in the document being created. For example the extended ASCII numbers may represent graphics characters, mathematical symbols, alphabetical characters used in languages other than English, and the like. Although an 8-bit extended ASCII system can define up to 256 characters, most documents rarely use other than the 96 most common ASCII characters. Thus, of the 256 ASCII character codes, about 160 codes appear only infrequently, if ever, in a typical text document. Since in most documents the upper four bits of the ASCII code are usually all zeros, the ASCII system is not particularly efficient.

The present invention replaces a standard 8-bit ASCII or similar encoding system with an 8-bit Crandall code. In addition to assigning each commonly encountered character a unique code number, a Crandall code also assigns each of several commonly encountered groups of characters a unique 8-bit code number. By using Crandall encoded bytes instead of standard ASCII encoded bytes to represent characters in the main dictionary, the compression system of the present invention achieves an additional level of dictionary compression since one Crandall code byte can represent two or more characters of a main dictionary word.

FIG. 8 illustrates an example of a Crandall code suitable for compressing a main dictionary for English language documents. Code numbers 1–31 represent common combinations of word terminators appearing as main dictionary words. Most codes 32–126 represent single characters most commonly appearing in English language text documents and on most computer keyboards in English-speaking countries. Codes 132–255 represent two-character combinations commonly appearing in English language text documents. Seven code values 32, 44 46, and 127–131 are unassigned in FIG. 8 but could be assigned at compression time to cover up to seven additional characters appearing in the particular text file being compressed. Crandall code number 0 is a special "next byte" code used when an unusual character in the main dictionary is not directly represented by one of the other Crandall code numbers. In the compressed dictionary unusual characters are represented by two bytes. The first byte has Crandall code 0 while the second byte is the original 8-bit code for the unusual character.

The Crandall code of FIG. 8 is suitable for most English-language documents. However for other languages commonly employing characters not included in the code of FIG. 8, or having a different set of most common character combinations, it may be desirable to employ a suitably modified Crandall code to maximize compression. Thus a compression system in accordance with the present invention, when used to compress documents in more than one language, may be provided with separate Crandall codes for each such language so that it may choose a Crandall code suitable for the language of the text document to be compressed. Alternatively a suitable Crandall code may be generated at compression time by counting occurrence of characters and character combinations in the main dictionary and assigning Crandall code numbers to the most commonly occurring characters and character combinations. A custom generated Crandall code will normally provide a measure of compression over using a predetermined Crandall code, though at the cost of increased processing time.

Thus as a third dictionary compression technique, the system replaces ASCII encoded characters of dictionary words, not otherwise compressed as matching leading characters or common suffixes, with Crandall encoded characters suitably of the type illustrated in FIG. 8. This further compresses the main dictionary by representing many frequently occurring combinations of two or more characters with a single byte.

Figure 9:
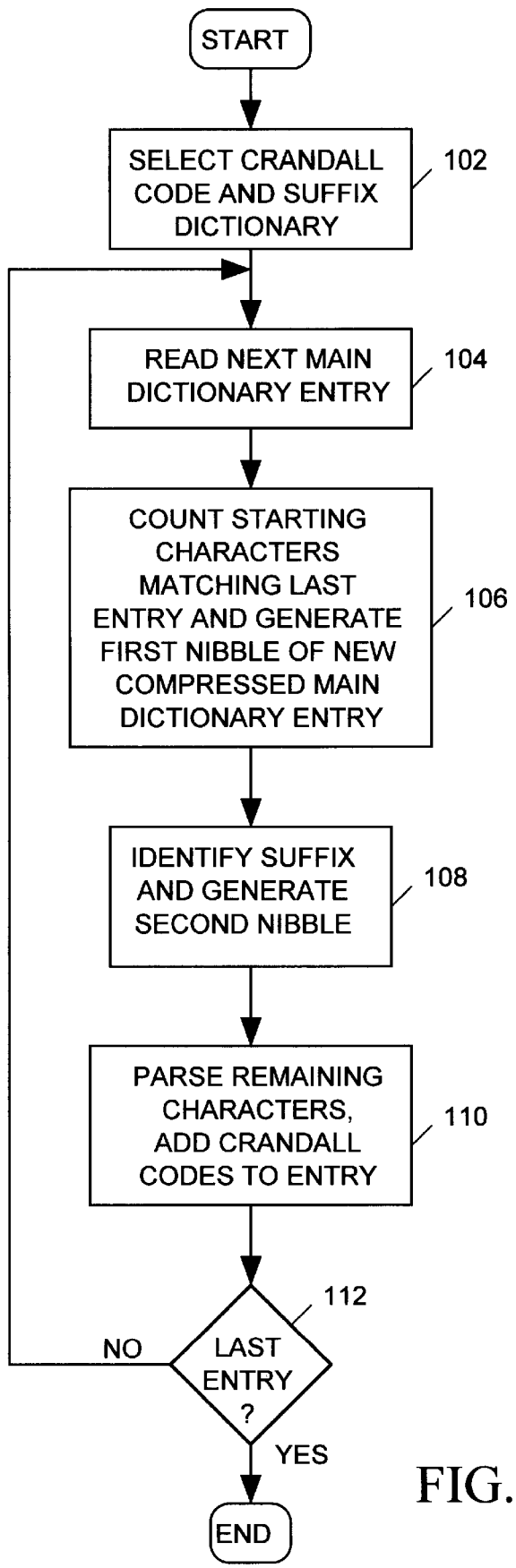

FIG. 9 is a flow chart illustrating a routine for carrying out the dictionary compression step 46 of the main compression routine of FIG. 2. Starting at step 102, the routine first selects or generates an appropriate Crandall code and suffix dictionary for the document to be compressed. We assume for illustrative purposes that the routine selects the Crandall code of FIG. 8 and the suffix dictionary of Table 3 above. The routine then reads a next main dictionary entry, initially the first main dictionary entry (step 104). Counting the number of starting characters of that entry matching starting characters of a next preceding dictionary entry, the routine the generates the first nibble of a new compressed dictionary entry (step 106).

Assume, for example that the first entry is "abated<sp>" and that the second dictionary entry is "abatement.<sp><sp>". The first nibble of the first compressed dictionary entry will have value 0000 indicting that the entry has no starting characters in common with a preceding entry. The routine then parses the word to determine whether it has a listed suffix and generates the appropriate second nibble of the compressed dictionary entry in accordance with the suffix dictionary of Table 3 (step 108). For the first word "abated<sp>, the second nibble has value 1001 (9 decimal) since suffix "ed" appears on the suffix dictionary. Thus the first byte of the compressed entry is 00001001 (9 decimal). Finally the routine parses the remaining characters of the entry selecting and storing representative Crandall code values in corresponding compressed dictionary entry. For the first dictionary entry "abated<sp>" the routine chooses code value 97 to represent the character a, value 98 to represent character b, value 139 to represent character pair "at" and value 1 to represent the single space character. Therefore the first entry "abated<sp>" is represented in the compressed dictionary as a series of five bytes (9, 97, 98, 139, 1) instead of a series of seven character bytes.

If the entry just compressed is not the last entry of the main dictionary (step 112) the routine returns to step 102 to repeat the process for the next dictionary entry. In the example case, the next entry is the word "abatement.<sp><sp>". At step 104 the first nibble of the second compressed dictionary entry is given the value 5 (0101) because the first five characters of the second entry match those of the first entry. The second nibble of the second compressed dictionary entry is assigned the value 3 (0011) because the suffix "ent" appears as item 3 on the suffix dictionary (Table 2). The first byte of the second entry of the compressed dictionary therefore has value 01010011 (decimal 83). At step 110 the routine chooses Crandall code value 109 to represent the "m" and code value 14 to represent the three character word terminator ".<sp><sp>". Thus the second entry of the compressed dictionary employs just three bytes of value 83, 109 and 14 to represent the word "abatement.<sp><sp>". The uncompressed main dictionary uses 12 bytes.

After compressing all entries of the main dictionary in a similar manner, the routine ends at step 112. Note that the dictionary compression routine of FIG. 9 carries out all three compression steps on each given dictionary entry before going on to a next entry. Unless the routine generates a custom Crandall code or suffix table at step 102, it is not necessary for the routine to access any dictionary entry more than once.

Decompression

The compressed form of text file 16 of FIG. 1, represented by the compressed text data 18, includes the common word dictionary 22, the word index 24 and the compressed main dictionary 26, along with the particular Crandall code list 28 and the suffix dictionary 30 used to compress the main dictionary. As mentioned above, in applications where the compressed data is to be transmitted to a remote computer, the compression routine of FIG. 2 can also store decompression software 32 to be transmitted as a part of the compressed text data 18. Because of the nature of the compression system, the decompression software 32 can be implemented with a relatively small amount of code, adding negligible overhead to transmission size of all but the smallest compressed documents.

Figure 10:
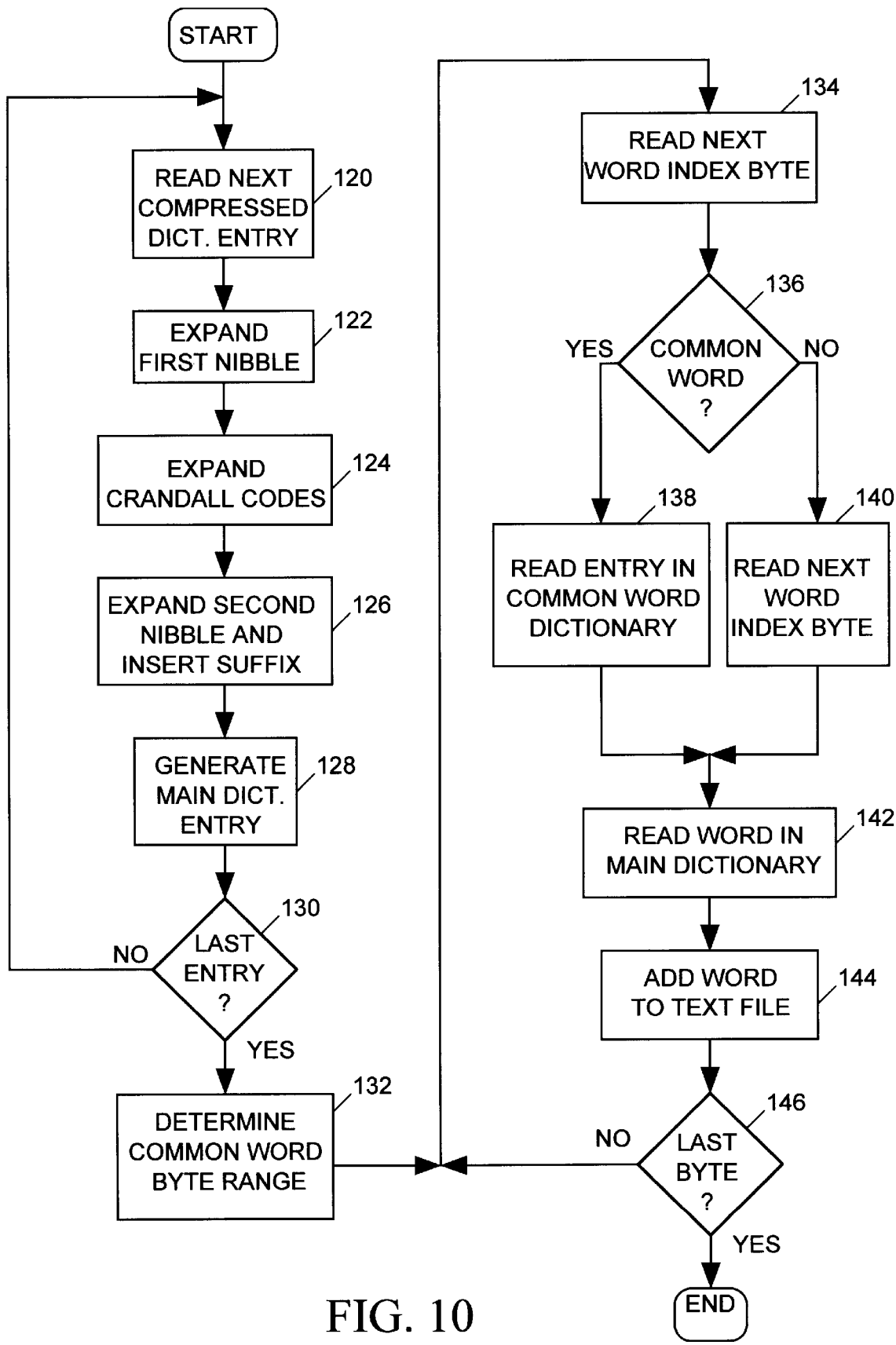

FIG. 10 illustrates a routine implemented by decompression software 32 in block diagram form. The routine first decompresses the main dictionary and then decompresses the word index. Starting at step 120, the routine reads a next (initially the first) entry of the compressed main dictionary 26 of FIG. 1. The routine then begins creating a corresponding entry of a decompressed main dictionary by expanding the first nibble of the compressed entry (step 122). The routine initially expands the first entry, copying the first N bytes of the preceding main dictionary entry into the new main dictionary entry, where N is the number indicated by the first nibble. (For the first main dictionary entry the value of the first nibble is zero.)

The decompression routine next expands the sequence of Crandall code bytes, if any, following the first byte of the compressed main dictionary entry (step 124) by applying each byte in succession to the Crandall code table 28 of FIG. 1 included with the compressed text data 18 and adding the result to the new main dictionary entry. The routine then expands the second nibble of the first byte of the compressed dictionary entry by applying that nibble to the suffix dictionary 30 included with the compressed text data 18 (step 126). The resulting suffix is inserted into the new main dictionary entry immediately before any word terminators. The routine then generates the new main dictionary entry by writing the expanded word at a next position thereof (step 128). If the word just processed was not the last entry of the compressed main dictionary (step 130), the routine returns to step 120 to repeat the expansion process for the next compressed dictionary entry.

When at step 130 all words of the compressed main dictionary have been expanded and added to the reconstituted main dictionary, the routine determines the range of the bytes referencing the common word dictionary (step 132). It can do this, for example, by counting the number of entries in the common word dictionary and subtracting the result from 255. The routine is now ready to expand the word index to recreate the original text file 16 of FIG. 1.

At step 134 the routine reads a next byte (initially the first byte) of the word index 24 of FIG. 1. If the value of the byte is within the range of common word dictionary entry numbers (step 136), the routine reads a two byte main dictionary entry number out of common word dictionary 22 of FIG. 1. If the value of the byte is not within the range of common word dictionary entry numbers, the routine reads the next byte out of the word list to form a two byte main dictionary entry number (step 140). After step 138 or step 140, the routine reads the word stored in the referenced entry of the expanded main dictionary (step 142) and appends that word to the text file being reconstructed (step 144). If the last byte read out of the word index is not the last byte of the word index (step 146), the routine returns to step 134 to begin processing the next word index byte. After all bytes of the word index have been processed per steps 134–146, the reconstructed text file is complete and the routine ends following step 146.

Style List Compression

Some word processing systems embed control codes in a text file for controlling the style in which characters are displayed or printed, including for example, font size, type and color, underlining, superscript, subscript and the like. The compression system of the present invention treats these control codes the same as any other characters when compressing the text file.

Other word processing systems do not embed style control codes in the text itself but instead provide a separate style data structure. That data structure is typically a data list of the form shown in Table 4 below.

TABLE 4

50
A
75
B
80
A
.
.
.

A text document will typically have a default style. The style data structure of Table 4 indicates that at character position 50 in the text, the style changes to a particular style A. (A character at position K is defined as the Kth character of the text document.) Thereafter, at position 75 of the file, the style changes to another style B. At character position 80 the style reverted back to style A. Thus the style data structure is simply a list of text positions at which the text style change along with data identifying the new styles.

In large documents, the character position data values can require several bytes. Each style type entry (e.g. styles A and B) can also require several bytes because there are often so many variations on style to choose from. Thus in long documents with frequent style changes, the style data structure can be quite large. The compression system of the present invention compresses the style data structure by compressing both the position data and the style data.

The position data is compressed by converting it to distance data. That is, instead of indicating the character position of a style change within the document in terms of the number of characters between the start of the document and the point of style change, the distance data indicates a character distance between style changes. In documents where styles change frequently, the distances between style changes are much smaller numbers than the document positions of changes and can often be represented with fewer bytes.

The style data is compressed by creating a style dictionary including an entry for each unique style data value appearing in the style data structure. Although a document may have numerous style changes, the total number of unique styles appearing in a document is usually relatively small. Since documents rarely have more than 256 unique styles, a one byte reference to a style dictionary entry is sufficient to replace the STYLE data. Thus in accordance with the invention, the style data structure of Table 4 is converted to a compressed style data structure as shown in Table 5 in combination with a style dictionary as illustrated in Table 6.

TABLE 5

| 50 |
| 1 |
| 25 |
| 2 |
| 5 |
| 1 |
| . |
| . |
| . |

TABLE 6

| A |
| B |
| . |
| . |
| . |

In Table 5, the distance to the first style change is 50 characters. A one byte pointer of value "1" appearing after distance "50" points to the first entry "A" of the style dictionary of Table 6. The second style change occurs 25 characters later. A one byte pointer of value "2" appearing after distance "25" refers to the second entry "B" of style dictionary of Table 6. The third style change occurs 5 characters after the second. The pointer of value "1" refers back to the first style dictionary "A". Although in this simple example Tables 5 and 6 actually require more data than Table 4, for typical text files having many changes between a relatively few styles, the style information presented in the form of Tables 5 and 6 will be much smaller than the same information presented in the form of Table 4. In the preferred embodiment of the invention, the compressed style data structure of Table 5, along with the style dictionary of Table 6 are appended to the word index 24 of FIG. 1. The compressed style data may alternatively be included in compressed text data 18 as separate files.

Compressed File Structure

While the common word dictionary 22, the word index 24, the compressed main dictionary 26, the Crandall code list 28, the suffix dictionary 30 and the decompression program 32 are all shown in FIG. 1 and described as being separate files in memory 12, one skilled in the art will understand that any or all of those files may be combined into a single file structure. In particular, when all files are combined with the decompression program 32, the compressed text data 18 becomes a single, self-extracting compressed text file. When decompression program 32 is written in a platform-independent language such as, for example Java, such a self-extracting file is particularly suitable for transmission on the Internet or other networks linking incompatible computer platforms.

Many text file formats organize documents into blocks such as pages or chapters. Those skilled in the art will recognize that the compression program described herein may be easily modified so that it creates a separate word index for each block of text, thereby maintaining the block structure of the document in its compressed form. Some text file formats, such as for example the HTML format used on the Internet, also allow non-textual material (e.g. graphics) to be inserted into a text document. For such documents, the compression program described herein may be used to compress only the text portions of a document. The non-textual material may be left in uncompressed form or may be compressed by other compression programs suitable for that type of material.

Table 7 below illustrates an example of the organization of a self-extracting file containing the decompression program and all of the data structures produced by the file compression system of the present invention. In this example, the uncompressed document had three pages. A drawing was inserted into page 1 and two photographs were inserted into page three. The original document file employed different graphics data formats for the drawing and the photograph.

TABLE 7

| Software |
| --- |
| 0 |
| (Length) |
| Header |
| (Length) |
| Main Dictionary |
| 2 |
| (Length) |
| Common Word Dictionary |
| 3 |
| (Length) |
| Crandall Code List |
| 4 |
| (Length) |
| Suffix Dictionary |
| 5 |
| (Length) |
| Word Index (page 1 start) |
| 7 |
| (Length) |
| Drawing |
| 6 |
| (Length) |
| Word Index (page 1 cont.) |
| 5 |
| (Length) |
| Word Index (page 2 start) |
| 5 |
| (Length) |
| Word Index (page 3 start) |
| 8 |
| (Length) |
| Photograph 1 |

TABLE 7-continued

Software

6

(Length)
Word Index (page 3 cont.)
8

(Length)
Photograph 2
6

(Length)
Word Index (page 3 cont.)

The file illustrated in Table 7 includes various data structures in the order shown. After the executable software, a Type code and a Length code precedes each data structure. The Type code is a single byte having a value indicating the nature of the data structure to follow. The Length code indicates the length of the data structure to follow in number of bytes. Table 8 below lists the Type codes.

TABLE 8

| Type Code | Data Structure Type |
| --- | --- |
| 0 | Header |
| 1 | Main dictionary |
| 2 | Common word dictionary |
| 3 | Crandall code list |
| 4 | Suffix dictionary |
| 5 | Word index (block start) |
| 6 | Word Index (block continuation) |
| 7 | Uncompressed data |
| 8–255 | Other compressed data structures |

As illustrated in Table 7, executable software is included at the front of the file so that it is executed when the file is called. The software includes the text file decompression program described herein but may also include routines for decompressing other file types as well as routines for displaying decompression results for selected document pages in response to user input. The first data file is a header (Type =0). The header may contain any general information needed by any of the software routines. The header may be omitted if no such information is needed. The main dictionary (Type =1), common word dictionary (Type =2), Crandall code list (Type =3) and suffix dictionary (Type =4) appear next.

The portion of the word index for document page 1 preceding the drawing in the original uncompressed data file follows the suffix dictionary. A starting portion of a word index is identified by Type code 5. The drawing data appears next. In this example, the drawing data was not compressed and is therefore identified as uncompressed data (Type =7). The word index for the portion of page 1 following the drawing data appears next. Since this data structure is a continuation of the word index for page 1, it is identified as a word index continuation (Type =6). The word index for page 2 (Type =5) and the word index for the portion of page 3 (Type =5) preceding the first photograph appear next.

The data structure for the first photograph appears next. In this example, the photographic data was compressed by non-textual compression software to provide a compressed graphics data file assigned Type 8 and the decompression program includes a routine for decompressing that type of data. (Various methods for compressing and decompressing graphics data are well-known in the art and are not further detailed herein.) The remaining data structures including continuations of the page 3 word index (Type=5) and the compressed data structure for the second photograph (Type= 8) appear in the order shown in Table 7.

When the software is executed, it reads the header information, the dictionaries and the Crandall code list into memory for future use. Thereafter the software scans down the file, calls the appropriate decompression routine for each compressed file structure type that it encounters, and assembles the decompressed file by sequentially appending the outputs of the called decompression routines. When it encounters an uncompressed data structure (Type 7), the software simply appends the data structure to the decompressed file under construction.

Block-by-Block Decompression

The file structure illustrated in Table 7 lends itself well to block-by-block decompression in which only one text block is decompressed and displayed at a time. For example upon execution, the software block of Table 7 may read the header information, the dictionaries and the Crandall code list into memory. The software may then decompress and display the first part of page 1, display the drawing, and then decompress and display the second part of page 1. The software will know when it has completely decompressed and displayed page one when it encounters the Type code 5 preceding the page 2 word index. Thereafter the software waits until it receives input from the user indicating that another page is to be displayed. For example, the user may ask the software to go to page 3. Since the length code preceding the page 2 indicates the file location of the end of page 2, it is not necessary for the software to scan through or process the compressed data for page 2 in order to reach the page 3 data. The processor simply jumps to the next data file location after the page 2 data where it encounters the Type code indicating that the data for a new third page is to follow. Thus the Type/Length codes marking the start of each data structure form a linked list that the decompression and display software can traverse to quickly hop from one data structure to another without having to scan through intervening data structures.

Partial Cloning

The compressed data file structure illustrated in Table 7 is particularly suitable in network applications where only a portion of a large document is to be transmitted from one network site to another. In such application the compressed data file can be "partially cloned" before transmission by copying only those portions of the file that are needed. For example, a page on an Internet server may include a mouse operable button that initiates transfer of a document file to the user's computer. When the user clicks the button on page, software in the server could first display a window asking for the particular document pages the user needs. After the user indicates the desired pages, the server software copies the data file to be transferred, removing any data structures that do not appear on the requested pages. In the example document file of Table 7, if the user were to request only page 3, the server software would sequentially scan the linked list of Type/Length data fields copying each data structure in the order encountered into a new file, while skipping the word index data structures relating to pages 1 and 2 and the page 1 drawing data structure. When the resulting partial clone is transmitted to the user's computer and the extraction software executed, the software will decompress and display only page 3 since that is the only data it encounters. Thus to produce a self-extracting file containing only a portion of a compressed document, the server need only remove the data structures relating to the unwanted portions of the document from the file. There is no need for the server to modify any of the remaining file data to inform the decompression software that a portion of the document is missing.

Thus has been shown and described a system for compressing an ASCII or similarly encoded text file so that it may be compactly stored, rapidly transmitted and easily expanded without need for supplemental translation information. While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

what is claimed is:

1. A method for compressing a text file representing a character-based document, the text file comprising a succession of character bytes, wherein each character byte is a collection of bits having a binary value representing a character, the method comprising the steps of:
  identifying some types of said characters bytes as word terminators such that said text file may be treated as a sequence of words, wherein each word is a sequence of character bytes beginning other than with a word terminator and including one or more word terminators only as ending characters thereof;
  generating a main dictionary comprising a plurality of entries, each main dictionary entry containing a unique dictionary word such that for each word of the text file there is a main dictionary entry containing a matching main dictionary word; and
  generating data identifying a sequence of said main dictionary entries matching said sequence of word.

2. The method in accordance with claim 1 further comprising the step of
  generating a common word dictionary comprising a plurality of common word entries, each common word entry containing a reference to a separate one of said main dictionary entries.

3. The method in accordance with claim 2 wherein the step of generating data identifying said sequence of main dictionary entries comprises the step of generating a word index comprising a sequence of references to common word dictionary entries and to main dictionary entries.

4. The method in accordance with claim 3 wherein each reference to a main dictionary entry consists of an upper byte and a lower byte having a collective value identifying a main dictionary entry and wherein each reference to a common word dictionary entry consists of one byte having a value identifying a common word dictionary entry.

5. The method in accordance with claim 4
  wherein upper bytes of all references to main dictionary entries have values within a first set of values,
  wherein one byte references to all common word dictionary entries have values within a second set of values, and
  wherein said first and second sets of values are non-overlapping.

6. The method in accordance with claim 1 further comprising the step of generating for each main dictionary entry containing a dictionary word, a compressed main dictionary entry containing data representing the dictionary word in a more compact form than is represented by the main dictionary entry.

7. The method in accordance with claim 1 further comprising the step of ordering said main dictionary entries so as to maximize a number of leading character bytes a word of each main dictionary entry, other than a first main dictionary entry, has in common with a word contained in its next preceding main dictionary entry.

8. The method in accordance with claim 7 further comprising the step of generating a separate compressed dictionary entry corresponding to each main dictionary entry, wherein each entry of the compressed dictionary contains first data indicating a number of character bytes a word contained in a main dictionary preceding the corresponding main dictionary entry has in common with a word contained in the corresponding main dictionary entry.

9. The method in accordance with claim 8 wherein each entry of the compressed dictionary also contains second data indicating whether a word contained in the corresponding main dictionary entry includes one of a limited set of common suffixes, wherein a suffix is a sequence of character bytes in a word immediately preceding its one or more word terminators.

10. The method in accordance with claim 1 further comprising the step of generating a separate compressed dictionary entry corresponding to each main dictionary entry, wherein each of the compressed dictionary entries contains a sequence of data values representing the word contained in its corresponding main dictionary entry, wherein a portion of the data values are encoded to represent individual character bytes and others are encoded to represent sequences of character bytes.

11. The method in accordance with claim 1 further comprising the steps of:
  ordering said main dictionary entries so as to maximize a number of leading character bytes a word of each main dictionary entry, other than a first main dictionary entry, has in common with a word contained in its next preceding main dictionary entry; and
  generating a separate compressed dictionary entry corresponding to each main dictionary entry, wherein entries of the compressed dictionary comprise:
    a first data value indicating a number of character bytes a word contained in a main dictionary preceding the corresponding main dictionary entry has in common with a word contained in the corresponding main dictionary entry;
    a second data value indicating whether a word contained in the corresponding main dictionary entry incudes one of a limited set of common suffixes, wherein a suffix is a sequence of character bytes in a word immediately preceding its one or more word terminators; and
    third data values each encoded to represent individual character bytes of a word contained in a corresponding main dictionary entry.

12. The method in accordance with claim 11 wherein entries of the compressed main dictionary further comprise
  fourth data values each encoded to represent sequences of character bytes included in a word contained in a corresponding main dictionary entry.

13. A method for compressing a text file representing a character-based document, the text file comprising a succession of character bytes, wherein each character byte is a collection of bits having a binary value representing a character, the method comprising the steps of:
  identifying some types of said characters bytes as word terminators such that said text file may be treated as a sequence of words, wherein each word is a sequence of character bytes beginning other than with a word terminator and including one or more word terminators only as ending characters thereof;

generating a main dictionary comprising a plurality of entries, each main dictionary entry containing a unique dictionary word such that for each word of the text file there is main dictionary entry containing a matching main dictionary word, the main dictionary entries being ordered so as to maximize a number of leading character bytes a word of each main dictionary entry, other than a first main dictionary entry, has in common with a word contained in its next preceding main dictionary entry;

generating a common word dictionary comprising a plurality of common word entries, each common word entry containing a reference to a separate one of said main dictionary entries;

generating a word index comprising a sequence of references to common word dictionary entries and to main dictionary entries, wherein each reference to a main dictionary entry consists of upper and lower bytes having a collective value identifying a main dictionary entry and wherein each reference to a common word dictionary entry consists of one byte having a value identifying a common word dictionary entry wherein upper bytes of all references to main dictionary entries have values within a first set of values, wherein one byte references to all common word dictionary entries have values within a second set of values, and wherein said first and second sets of values are non-overlapping.

14. The method in accordance with claim 13 further comprising the step of generating a separate compressed dictionary entry corresponding to each main dictionary entry, wherein each entry of the compressed dictionary contains first data indicating a number of character bytes a word contained in a main dictionary preceding the corresponding main dictionary entry has in common with a word contained in the corresponding main dictionary entry.

15. The method in accordance with claim 14 wherein each entry of the compressed dictionary also contains second data indicating whether a word contained in the corresponding main dictionary entry incudes one of a set of suffixes, wherein a suffix is a sequence of character bytes in a word immediately preceding its one or more word terminators.

16. The method in accordance with claim 13 further comprising the step of generating a separate compressed dictionary entry corresponding to each main dictionary entry, wherein each of the compressed dictionary entries contains a sequence of data values representing the word contained in its corresponding main dictionary entry, wherein at least one data value of at least one compressed dictionary entry is encoded to represent sequences of character bytes.

17. The method in accordance with claim 13 further comprising the steps of:

generating a separate compressed dictionary entry corresponding to each main dictionary entry, wherein each entry of the compressed dictionary contains a sequence of data values representing the word contained in the corresponding main dictionary entry, wherein said data values of at lest one compressed dictionary entry comprise:

a first data value indicating a number of character bytes a word contained in a main dictionary preceding the corresponding main dictionary entry has in common with a word contained in the corresponding main dictionary entry, a second data value indicating whether a word contained in the corresponding main dictionary entry incudes one of a limited set of common suffixes, wherein a suffix is a sequence of character bytes in a word immediately preceding its one or more word terminators, and third data values each encoded to represent individual character bytes of a word contained in a corresponding main dictionary entry.

18. The method in accordance with claim 17 wherein said data values of said one compressed dictionary entry further comprise fourth data values each encoded to represent sequences of character bytes included in a word contained in a corresponding main dictionary entry.

19. A method for compressing a text file representing a character-based document, the text file including a succession of character bytes, wherein each character byte is a collection of bits having a binary value representing a character, the text file also including a first style data structure comprising a list of corresponding position and style data values, wherein each position data value indicates a number of characters from a first character of said document at which a character style change occurs and wherein the corresponding style data value indicates a character style to which a change is made, the method comprising the steps of:

generating data identifying a sequence of said main dictionary entries matching said sequence of words;

generating a style dictionary comprising a plurality of entries, each style data dictionary entry containing a unique style data value such that for each style data value of the first style data structure there is style data dictionary entry containing a matching style data value; and generating a second style data structure comprising a list of corresponding distance and style index data values derived from the position and style data values of the first style data structure, wherein each distance data value indicates a number of characters between one style change and a next style change in said document and wherein its corresponding style index data value references a style dictionary entry.

20. The method in accordance with claim 19 further comprising the steps of identifying some types of said characters bytes as word terminators such that said text file may be treated as a sequence of words, wherein each word is a sequence of character bytes beginning other than with a word terminator and including one or more word terminators only as ending characters thereof; and generating a main dictionary comprising a plurality of entries, each main dictionary entry containing a unique dictionary word such that for each word of the text file there is main dictionary entry containing a matching main dictionary word.

21. A method for transmitting a text file representing a character-based document from a first computer to a second computer, the text file comprising a succession of character bytes, wherein each character byte is a collection of bits having a binary value representing a character, the method comprising the steps of:

said first computer identifying some types of said characters bytes as word terminators such that said text file may be treated as a sequence of words, wherein each word is a sequence of character bytes beginning other than with a word terminator and including one or more word terminators only as ending characters thereof;

said first computer generating a main dictionary comprising a plurality of main dictionary entries, each main dictionary entry containing a unique dictionary word such that for each word of the text file there is main dictionary entry containing a matching main dictionary word;

said first computer generating a common word dictionary comprising a plurality of common word entries, each common word entry containing a reference to a separate one of said main dictionary entries;

said first computer generating a word index including references to said main dictionary entries and to said common dictionary entries;

said first computer generating a compressed main dictionary wherein for each main dictionary entry containing a dictionary word there is a compressed main dictionary entry containing data representing the dictionary word in a more compact form than the dictionary word itself;

said first computer transmitting said compressed main dictionary, said common word dictionary, and said word index to said second computer; and said second computer recreating said text file in response to said compressed main dictionary, said common word dictionary, and word index.

22. The method in accordance with claim 21 wherein each reference in said word index to a main dictionary entry consists of upper and lower bytes having a collective value identifying a main dictionary entry and wherein each reference in said word index to a common word dictionary entry consists of one byte having a value identifying a common word dictionary entry, wherein upper bytes of all references to main dictionary entries have values within a first set of values, wherein one byte references to all common word dictionary entries have values within a second set of values, and wherein said first and second sets of values are non-overlapping.

23. The method in accordance with claim 21 further comprising the step of:

said first computer ordering said main dictionary entries so as to maximize a number of leading character bytes a word of each main dictionary entry, other than a first main dictionary entry, has in common with a word contained in its next preceding main dictionary entry, wherein each entry of the compressed dictionary contains first data indicating a number of character bytes a word contained in a main dictionary preceding the corresponding main dictionary entry has in common with a word contained in the corresponding main dictionary entry.

24. The method in accordance with claim 23 wherein each entry of the compressed dictionary also contains second data indicating whether a word contained in the corresponding main dictionary entry incudes one of a limited set of common suffixes, wherein a suffix is a sequence of character bytes in a word immediately preceding its one or more word terminators.

25. The method in accordance with claim 24 wherein compressed dictionary contain data values representing words contained in their corresponding main dictionary entries, wherein at least one of said data values is encoded to represent a sequence of character bytes.

26. The method in accordance with claim 21 further comprising the step of said first computer transmitting a decompression program to said second computer with said compressed main dictionary, said common word dictionary, and said word index, said second computer executing said decompression program to carry out the step of recreating said text file in response to said compressed dictionary, said common word dictionary, and word index.

27. An apparatus for compressing a text file comprising means for creating a main dictionary listing all unique words of the text file, means for creating a common word dictionary referencing the most commonly encountered words in the text file, wherein each word is a sequence of character bytes beginning other than with a word terminator and including one or more word terminators only as ending characters thereof, and means for creating a word index listing references to common and main dictionary words.

28. The apparatus in accordance with claim 27 further comprising means for generating a compressed main dictionary wherein for each main dictionary word, there is a corresponding compressed main dictionary entry representing the word in a more compact form than as represented the main dictionary.

29. The apparatus in accordance with claim 28 wherein at least one compressed main dictionary entry represents leading characters of a main dictionary word matching leading characters of a next preceding main dictionary word with data indicating the number of matching characters, and represents a main dictionary word suffixes with data referencing entries in a suffix dictionary.

30. The apparatus in accordance with claim 29 wherein said compressed main dictionary entry represents a sequence of characters with a single data value.

31. A method for generating a compressed data file representing a text file in more compact form, the text file comprising a first sequence of words, each word formed by at least one text character, the method comprising the steps of:

generating a dictionary comprising a plurality of entries, each dictionary entry defining a unique word of the text file;

storing in said compressed data file a first type code and a first length code, storing said dictionary in said compressed data file following said first type code and said first length code, wherein said first type code indicates said dictionary follows, and wherein said first length code indicates a length of said dictionary;

generating a word index comprising a second sequence of reference numbers, a reference number at each position of said second sequence referencing a dictionary entry defining a correspondingly positioned word of said first sequence;

storing in said compressed data file a second type code and a second length code; and storing said word index in said compressed data file following said second type code and said second length code, wherein said second type code indicates that said word index follows, and wherein said second length code indicates a length of said word index.

32. The method in accordance with claim 31 wherein the step of generating a dictionary comprises the substeps of:

generating an ordered list of unique words appearing in the text file, and generating an entry of the dictionary corresponding to each word of the ordered list, the entry containing data defining its corresponding word.

33. The method in accordance with claim 32 wherein each entry of said dictionary includes data indicating a number of characters the word the entry defines has in common with a word defined by a preceding entry of said dictionary.

34. The method in accordance with claim 32 further comprising the steps of:

storing a third data type code and a third length code in said compressed data file;

storing a word suffix list in said compressed data file after said third type code and said third length code, said word suffix list containing a plurality of entries, each containing a word suffix, wherein said third data type code indicates that said suffix list follows, wherein said third length code indicates a length of said suffix list, and wherein an entry of said dictionary represents a suffix of its defined word by referencing an entry of said word suffix list.

35. The method in accordance with claim 32 further comprising the steps of:

storing a fourth data type code and a fourth length code in said compressed data file;

storing a character list in said compressed data file after said fourth type code and said fourth length code, said character list including a plurality of entries, each referencing a unique sequence of text characters;

wherein said fourth data type code indicates that said character translation list follows, wherein said fourth length code indicates a length of said character code list, and wherein entries of said dictionary represent a sequence of text characters by referencing an entry of said character list.

* * * * *